(12) United States Patent
Chiu (10) Patent No.: US 8,797,097 B2
(45) Date of Patent: Aug. 5, 2014

(54) FILTERING DEVICE WITH LOW-PASS FILTERING FUNCTION AND BAND-PASS FILTERING FUNCTION

(75) Inventor: Pei-Ju Chiu, Taichung (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 13/609,285

(22) Filed: Sep. 11, 2012

(65) Prior Publication Data

US 2013/0328622 A1 Dec. 12, 2013

(30) Foreign Application Priority Data

Jun. 7, 2012 (TW) .............................. 101120480 A (51) Int. Cl.
*H03K 5/00* (2006.01)
(52) U.S. Cl.
USPC ............................. 327/552; 327/557; 327/558
(58) Field of Classification Search
USPC .................. 327/551–559, 336–337
See application file for complete search history.

(56) References Cited

U.S. PATENT DOCUMENTS

| 8,111,097 | B1 | 2/2012 | Kutz |
| 8,260,212 | B2 * | 9/2012 | Chien ............................. 455/73 |
| 8,299,850 | B1 * | 10/2012 | Kutz et al. ........................ 330/9 |
| 8,508,291 | B1 * | 8/2013 | Alzaher ........................ 327/553 |

* cited by examiner

*Primary Examiner* — Dinh T. Le
(74) *Attorney, Agent, or Firm* — Winston Hsu; Scott Margo (57) ABSTRACT

A filtering device, applicable in a transceiver, includes: a capacitive circuit coupled to an amplifying circuit by a first capacitive configuration or by a second capacitive configuration; and a resistive circuit coupled to the amplifying circuit by a first resistive configuration or by a second resistive configuration; wherein when the capacitive circuit is the first capacitive configuration, the filtering device is used to perform a first filtering process upon a receiving signal of the filtering device, and when the capacitive circuit is the second capacitive configuration, the filtering device is used to perform a second filtering process upon a transmitting signal of the filtering device.

12 Claims, 5 Drawing Sheets

FILTERING DEVICE WITH LOW-PASS FILTERING FUNCTION AND BAND-PASS FILTERING FUNCTION

BACKGROUND OF THE INVENTION

1. Field of the Invention

The disclosed embodiments of the present invention relate to a filtering device, and more particularly, to a filtering device with low-pass and band-pass filtering functions.

2. Description of the Prior Art

In conventional wireless transceiver systems, when the wireless transceiver system operates in a receiving mode, a filter is usually employed to filter received wireless signals in order to generate a filtered signal for further signal processing in the transceiver system. On the other hand, when the wireless transceiver system operates in a transmitting mode, a different filter is employed to perform the filtering process in order to generate a wireless signal for transmission. Generally speaking, the aforementioned two filters exist independently to avoid interference and/or crosstalk between the receiving and transmitting signals. However, installing two independent filters in one wireless transceiver system consumes a larger area (e.g., a larger area in an integrated circuit), and thus increases the cost of the conventional wireless transceiver system. Therefore, the design of a filter circuit in a wireless transceiver system with lower cost is a significant concern in this pertinent field.

SUMMARY OF THE INVENTION

One objective of the present invention is to provide a filtering device with a low-pass filtering function and a band-pass filtering function.

In accordance with an exemplary embodiment of the present invention, a filtering device for a transceiver system is disclosed. The filtering device includes a capacitive circuit and a resistive circuit. The capacitive circuit is coupled to the amplifying circuit by a first capacitive configuration or by a second capacitive configuration, wherein the first capacitive configuration is different from the second capacitive configuration. The resistive circuit is coupled to the amplifying circuit by a first resistive configuration or by a second resistive configuration, wherein the first resistive configuration is different from the second resistive configuration, wherein when the capacitive circuit is the first capacitive configuration, the filtering device is used to perform a first filtering process upon the receiving signal, and when the capacitive circuit is the second capacitive configuration, the filtering device is used to perform a second filtering process upon the transmitting signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
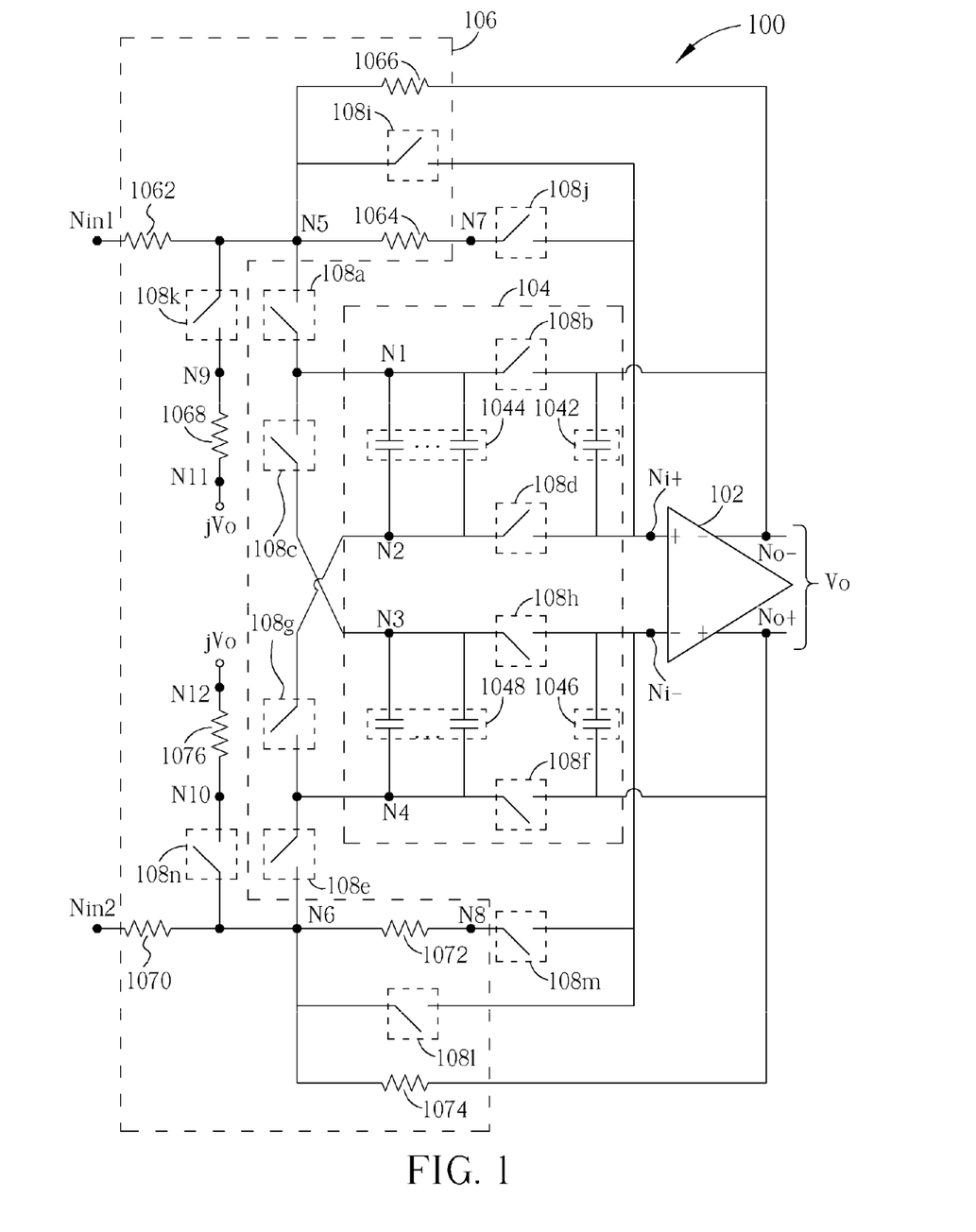
FIG. 1 is a diagram illustrating a filtering device according to an exemplary embodiment of the present invention.

Please refer to FIG. 1. FIG. 1 is a diagram of an exemplary embodiment illustrating a filtering device 100. The filtering device 100 includes an amplifying circuit 102, a capacitive circuit 104, a resistive circuit 106, and a plurality of switches 108a-108n. The capacitive circuit 104 is coupled to the amplifying circuit 102 through a first capacitive configuration or a second capacitive configuration, wherein the capacitive circuit 104 is configured to switch between the first capacitive configuration and the second capacitive configuration, which are different. The resistive circuit 106 is coupled to the amplifying circuit 102 through a first resistive configuration or a second resistive configuration, wherein the resistive circuit 104 is configured to switch between the first resistive configuration and the second resistive configuration, which are different. When the capacitive circuit 104 is under the first capacitive configuration and the resistive circuit 106 is under the first resistive configuration, the filtering device 100 is used to perform a first filtering process, and when the capacitive circuit 104 is under the second capacitive configuration and the resistive circuit 106 is under the second resistive configuration, the filtering device 100 is used to perform a second filtering process which is different from the first filtering process. Please note that, in this embodiment, the first filtering process is a band-pass filtering process, and the second filtering process is a low-pass filtering process. Furthermore, the filtering device 100 is installed and/or disposed in a wireless transceiver system. When the wireless transceiver system operates in a receiving mode, the filtering device 100 would be switched to an operating mode in which the first filtering process (i.e., the band-pass filtering process) is performed to band-pass filter a received wireless signal and to transmit the filtered signal to a processing circuit in the transceiver system (not shown) for subsequent signal processing. On the other hand, when the wireless transceiver system operates in a transmitting mode, the filtering device 100 would be switched to an operating mode in which the second filtering process (i.e., the low-pass filtering process) is perform to generate a wireless signal for transmission.

According to the embodiment of the present invention, the amplifying circuit 102 may be a differential operational amplifier with a first input terminal Ni+, a second input terminal Ni−, a first output terminal No−, and a second output terminal No+. The capacitive circuit 104 in this embodiment includes a first part capacitive circuit 1042, a second part capacitive circuit 1044, a third part capacitive circuit 1046, and a fourth part capacitive circuit 1048. The resistive circuit 106 includes a first part resistive circuit 1062, a second part resistive circuit 1064, a third part resistive circuit 1066, a fourth part resistive circuit 1068, a fifth part resistive circuit 1070, a sixth part resistive circuit 1072, a seventh resistive circuit 1074, and an eighth resistive circuit 1076. The first part capacitive circuit 1042 is coupled between the first input terminal Ni+ and the first output terminal No− of the amplifying circuit 102. The second part capacitive circuit 1044 is coupled between terminals N1 and N2 of the filtering device 100. The third part capacitive circuit 1046 is coupled between the second input terminal Ni− and the second output terminal No+ of the amplifying circuit 102. The fourth part capacitive circuit 1048 is coupled between terminals N3 and N4 of the filtering device 100. The first part resistive circuit 1062 is coupled between a first signal input terminal Nin1 and a terminal N5 of the filtering device 100. The second part resistive circuit 1064 is coupled between the terminals N5 and N7 of the filtering device 100. The third part resistive circuit 1066 is coupled between the terminal N5 and the first output terminal No−. The fourth part resistive circuit 1068 is coupled between terminals N9 and N11 of the filtering device 100. The fifth part resistive circuit 1070 is coupled between a second signal input terminal Nin2 and a terminal N6 of the filtering device 100. The sixth part resistive circuit 1072 is coupled between the terminals N6 and N8 of the filtering device 100. The seventh part resistive circuit 1074 is coupled between the terminal N6 and the second output terminal No+. The eighth part resistive circuit 1076 is coupled between terminals N10 and N12 of the filtering device 100. Please note that, in this embodiment, the terminals N11 and N12 are respectively coupled to the first output terminal No− and the second output terminal No+ of the amplifying circuit 102, and arranged for feeding back an imaginary signal (i.e., jVo) of an output signal Vo generated from the amplifying circuit 102 to the terminals N11 and N12.

Besides, the first switch 108a is coupled between the terminals N5 and N1. The second switch 108b is coupled between the terminal N1 and the first output terminal No−. The third switch 108c is coupled between the terminals N1 and N3. The fourth switch 108d is coupled between the terminal N2 and the first input terminal Ni+. The fifth switch 108e is coupled between the terminals N6 and N4. The sixth switch 108f is coupled between the terminal N4 and the second output terminal No+. The seventh switch 108g is coupled between the terminals N4 and N2. The eighth switch 108h is coupled between the terminal N3 and the second input terminal Ni−. The ninth switch 108i is coupled between the terminal N5 and the first input terminal Ni+. The tenth switch 108j is coupled between the terminal N7 and the first input terminal Ni+. The eleventh switch 108k is coupled between the terminals N9 and N5. The twelfth switch 108l is coupled between the terminal N6 and the second input terminal Ni−. The thirteenth switch 108 is coupled between the terminal N8 and the second input terminal Ni−. The fourteenth switch 108n is coupled between the terminals N10 and N6.

Figure 2:
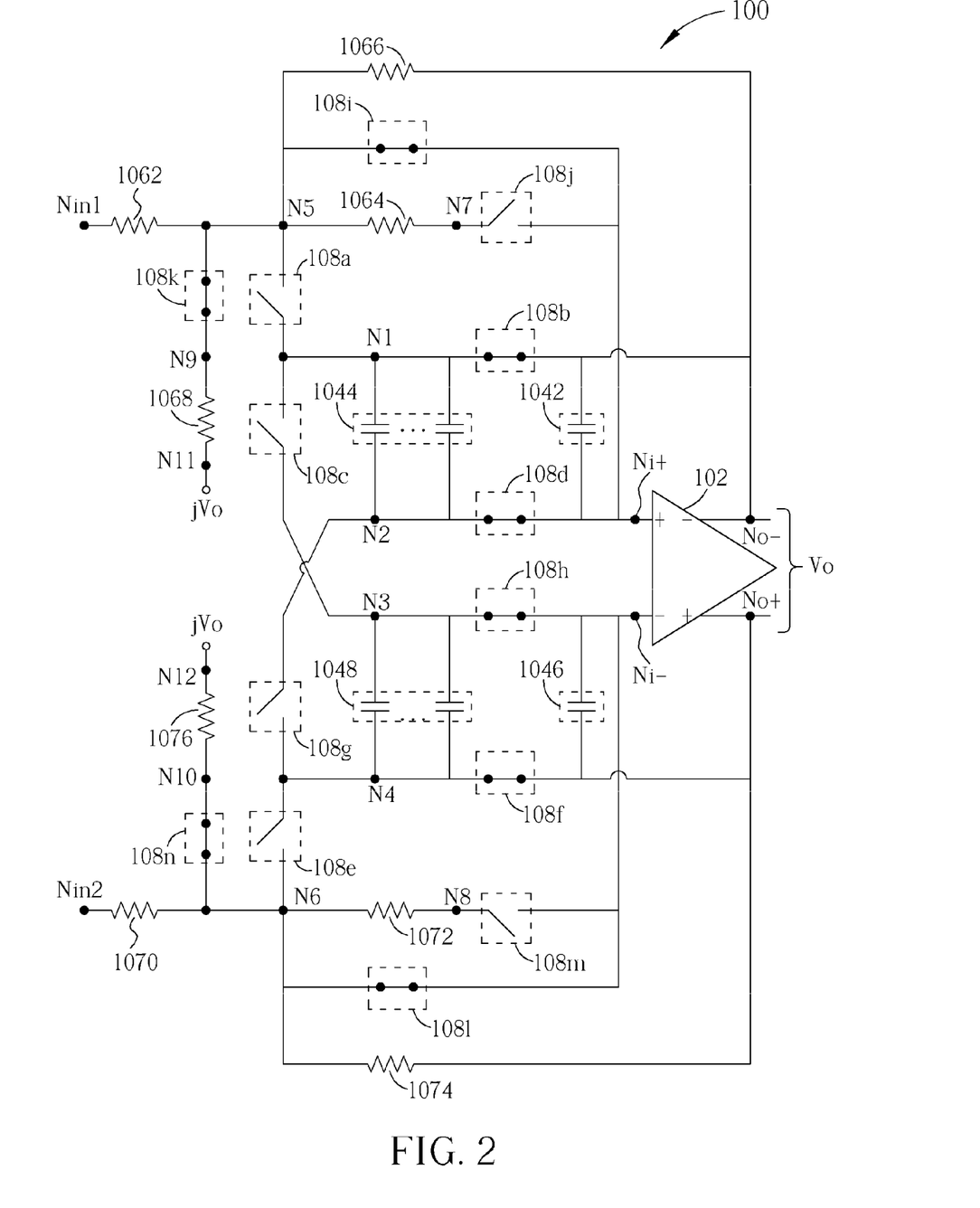
FIG. 2 is a diagram illustrating the filtering device operating in a band-pass filtering mode according to an exemplary embodiment of the present invention.
Figure 3:
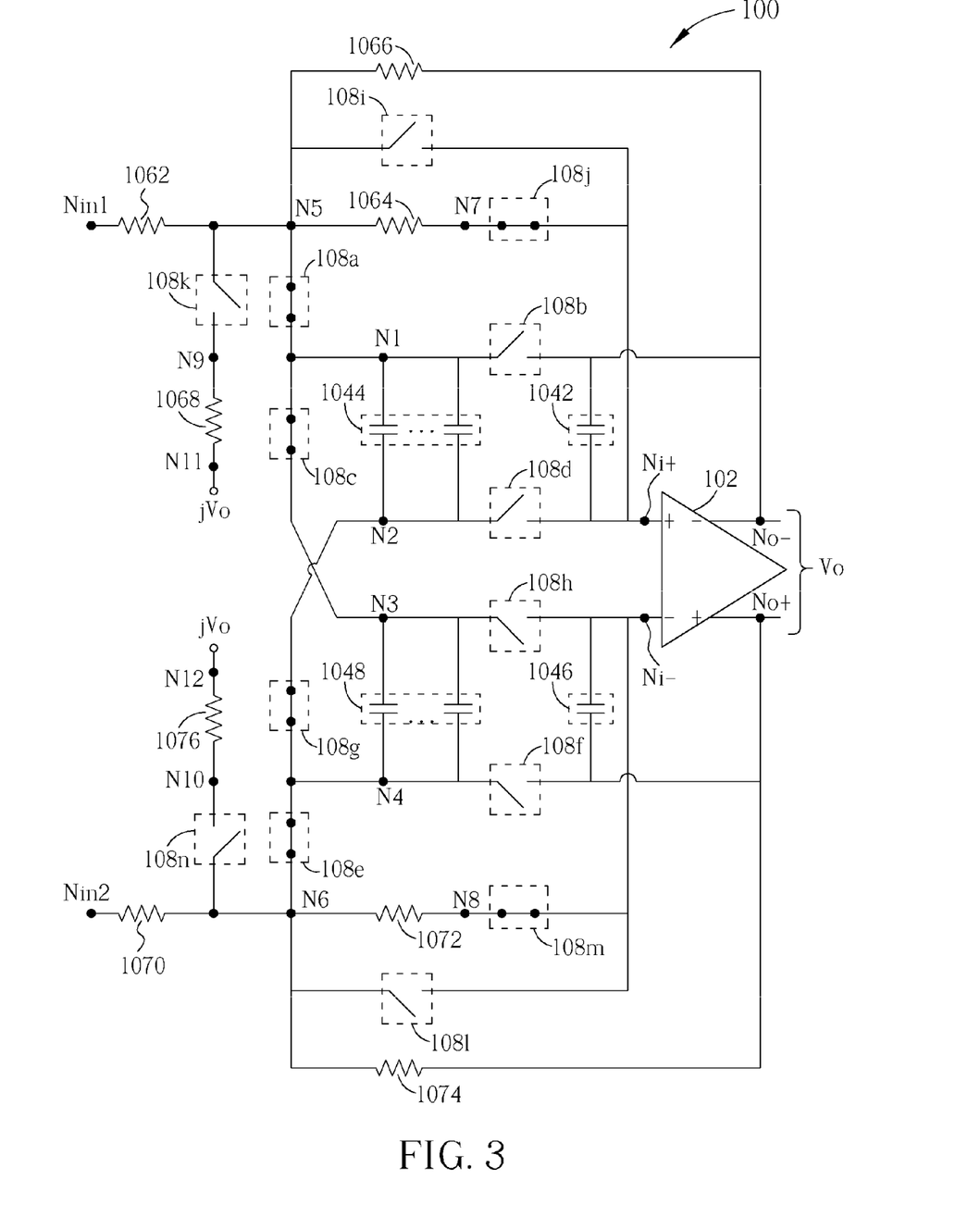
FIG. 3 is a diagram illustrating the filtering device operating in a low-pass filtering mode according to an exemplary embodiment of the present invention.

Please refer to FIG. 2 and FIG. 3. FIG. 2 is a diagram illustrating an exemplary embodiment of the filtering device 100 operating in a band-pass filtering mode. FIG. 3 is a diagram illustrating an exemplary embodiment of the filtering device 100 operating in a low-pass filtering mode. The capacitive circuit 104 operates in the first capacitive configuration and the resistive circuit 106 operates in the first resistive configuration when the filtering device 100 operates in the band-pass filtering mode. To put it another way, when the filtering device 100 operates in the band-pass filtering mode, the first switch 108a, the third switch 108c, the fifth switch 108e, the seventh switch 108g, the tenth switch 108j, and the thirteenth switch 108m would be switched off, and the second switch 108b, the fourth switch 108d, the sixth switch 108f, the eighth switch 108h, the eleventh switch 108k, the twelfth switch 108l, and the fourteenth switch 108n would be switched on, as shown in FIG. 2. Nonetheless, when the filtering device 100 operates in the low-pass filtering mode, the first switch 108a, the third switch 108c, the fifth switch 108e, the seventh switch 108g, the tenth switch 108j, and the thirteenth switch 108m would be switched on, and the second switch 108b, the fourth switch 108d, the sixth switch 108f, the eighth switch 108h, the ninth switch 108i, the eleventh switch 108k, the twelfth switch 108l, and the fourteenth switch 108n would be switched off, as shown in FIG. 3. It should be noted that the band-pass filtering process of this embodiment is for filtering out signal components outside of a frequency band which is greater than the zero-frequency, and the low-pass filtering process is for filtering out signal components outside of a band which contains the zero-frequency. Please note that when the filtering device 100 operates in the band-pass filtering mode, the filtering device 100 could also be switched to a single-ended band-pass filter. That is, when the filtering device 100 operates in the single-ended band-pass filtering mode, the first input terminal Ni+ of the amplifying circuit 102 is used to receive a wireless signal, the second input terminal Ni− is connected to a ground voltage, and the first output terminal No− is used to output a signal.

Figure 4:
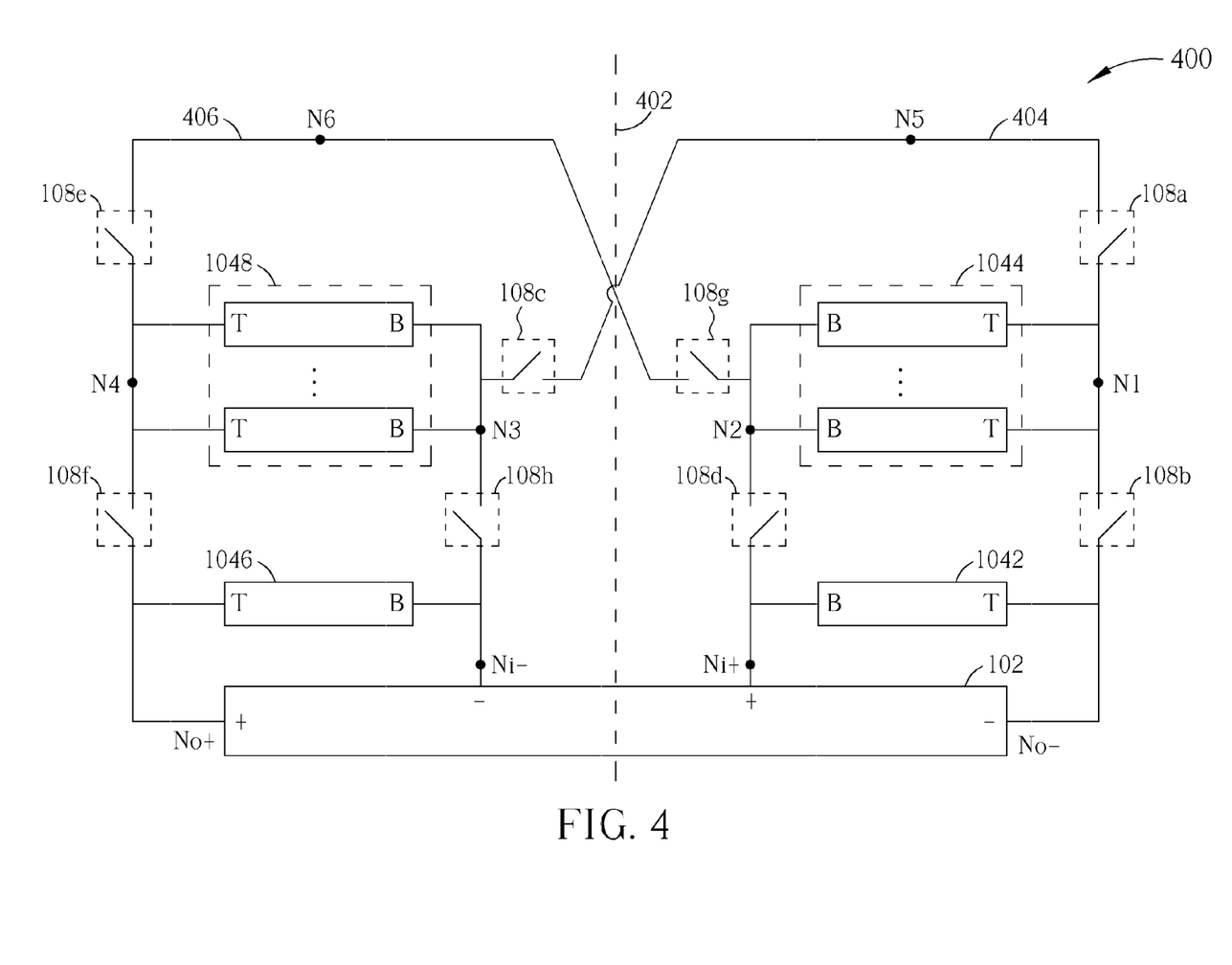
FIG. 4 is a diagram illustrating an integrated circuit layout of the amplifying circuit and the capacitive circuit according to an embodiment of the present invention.

Please refer to FIG. 4. FIG. 4 is a diagram illustrating an embodiment of an integrated circuit layout of the amplifying circuit 102 and the capacitive circuit 104. It should be noted that the layout of the resistive circuit 106 is not shown in FIG. 4 for simplicity. It can be seen from the integrated circuit layout 400 in FIG. 4 that the layout of the amplifying circuit 102 and the capacitive circuit 104 of the present invention is arranged in a symmetrical manner substantially. That is, a left partial layout and a right partial layout separated by a dividing line 402 are symmetrical to each other substantially. Furthermore, to obtain a fully symmetrical layout distribution of the capacitive circuits utilized by the filtering device 100 operating in either of the two filtering modes, the first layout layer of the first capacitive circuit 1042, the first layout layer of the second capacitive circuit 1044, the first layout layer of the third capacitive circuit 1046, and the first layout layer of the fourth capacitive circuit 1048 are set at the same layout layer (e.g., the bottom metal layout layer of the integrated circuit, where the first layout layer is regarded as the bottom metal layer B of the integrated circuit hereinafter for simplicity and clarity). The first layout layer of the first capacitive circuit 1042 and the first layout layer of the second capacitive circuit 1044 need to be set near the inner part at right side of the dividing line 402 in FIG. 4 (i.e., utilized to couple to the first input terminal Ni+ of the amplifying circuit 102), and the first layout layer of the third capacitive circuit 1046 and the first layout layer of the fourth capacitive circuit 1048 need to be set neat the inner part at left side of the dividing line 402 in FIG. 4 (i.e., utilized to couple to the second input terminal Ni− of the amplifying circuit 102). The first layout layer of the first capacitive circuit 1042, the second layout layer of the second capacitive circuit 1044, the second layout layer of third capacitive circuit 1046, and the second layout layer of the fourth capacitive circuit 1048 are set at another layout layer (e.g., the top metal layout layer of the integrated circuit, where the second layout layer is regarded as the top metal layer T of the integrated circuit hereinafter for simplicity and clarity). The second layout layer of the first capacitive circuit 1042 and the second layout layer of the second capacitive circuit 1044 need to be set near the outer part at right side of the dividing line 402 in FIG. 4 (i.e., utilized to couple to the first output terminal Ni− of the amplifying circuit 102), and the second layout layer of the third capacitive circuit 1046 and the second layout layer of the fourth capacitive circuit 1048 need to be set near the outer part at left side of the dividing line 402 in FIG. 4 (i.e., utilized to couple to the second output terminal No+ of the amplifying circuit 102). Please note that the present invention is not limited to the exemplary layout design using the bottom metal layer of the integrated circuit as the first layout layer and using the top metal layer of the integrated circuit as the second layout layer. Any layout design having the first layout layer and the second layout layer located at different metal layers would fall within the scope of the present invention.

Besides, the first switch 108a is coupled between the top metal layer T of the second capacitive circuit 1044 and the bottom metal layer B of the fourth capacitive circuit 1048. The second switch 108b is coupled between the top metal layer T of the first capacitive circuit 1042 and the top metal layer T of the second capacitive circuit 1044. The third switch 108c is coupled between the top metal layer T of the second capacitive circuit 1044 and the bottom metal layer B of the fourth capacitive circuit 1048. The fourth switch 108d is coupled between the bottom metal layer B of the first capacitive circuit 1042 and the bottom metal layer B of the second capacitive circuit 1044. The fifth switch 108e is coupled between the top metal layer T of the fourth capacitive circuit 1048 and the bottom metal layer B of the second capacitive circuit 1044. The sixth switch 108f is coupled between the top metal layer T of the third capacitive circuit 1046 and the top metal layer T of the fourth capacitive circuit 1048. The seventh switch 108g is coupled between the bottom metal layer B of the second capacitive circuit 1044 and the top metal layer T of the fourth capacitive circuit 1048. The eighth switch 108h is coupled between the bottom metal layer B of the third capacitive circuit 1046 and the bottom metal layer B of the fourth capacitive circuit 1048. It can be seen from FIG. 4 that a transmission line 404, which is coupled between the first switch 108a and the third switch 108c, and a transmission line 406, which is coupled between the fifth switch 108e and the seventh switch 108g, are intercrossing (but not connected to each other) on the dividing line 402. Accordingly, the first capacitive configuration and the second capacitive configuration of the capacitive circuit 104 are fully symmetrical, that is, whether the filtering device 100 operates in the band-pass filtering mode or the low-pass filtering mode.

Moreover, as can be seen from FIG. 1 and FIG. 4, each of the first capacitive circuit 1042 and the third capacitive circuit 1046 in this embodiment is implemented using a single capacitor, and each of the second capacitive 1044 and the fourth capacitive circuit 1048 in this embodiment is formed by multiple capacitors connected in parallel. In this embodiment, the number of the capacitors of second capacitive circuit 1044 and the number of the fourth capacitive circuit 1048 are both an integer multiple of the number of the capacitors of the first capacitive circuit 1042 (or the third capacitive circuit 1046). To put it another way, the capacitor of the first capacitive circuit 1042 or the third capacitive circuit 1046 may be regarded as the capacitor with minimum capacitance in the capacitive circuit 104. It should be noted that the present invention is not limited to the aforementioned embodiment. Any design would fall within the scope of the present invention as long as the capacitance of the employed second capacitive circuit 1044 is greater than the capacitance of the employed first capacitive circuit 1042, and/or the capacitance of the employed fourth capacitive circuit 1048 is greater than the capacitance of the employed third capacitive circuit 1046.

The following description is related to the method of deciding the capacitance values of the first capacitive circuit 1042 and the second capacitive circuit 1044 (or the third capacitive circuit 1046 and the fourth capacitive circuit 1048).

Figure 5:
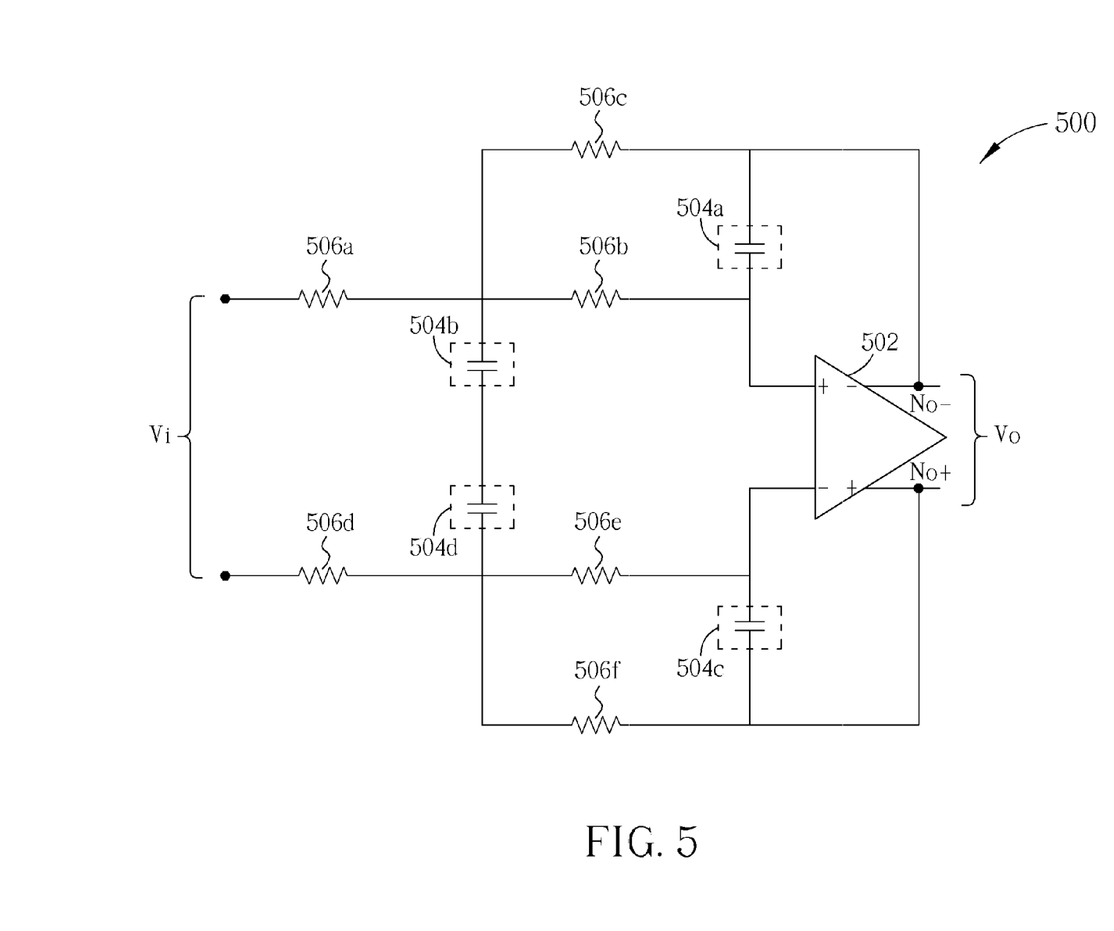
FIG. 5 is a diagram illustrating a differential low-pass filter according to an embodiment of the present invention.

Please refer to FIG. 5. FIG. 5 is a diagram illustrating an embodiment of a differential low-pass filter 500. The differential low-pass filter 500 includes a differential amplifier 502, a plurality of capacitors 504a-504d, and a plurality of resistors 506a-506f, wherein the capacitor 504a and the capacitor 504b are the same as the capacitor 504c and the capacitor 504d, respectively, and the resistors 506a, 506b, and 506c are the same as the resistors 506d, 506e, and 506f, respectively. In a case where the low-pass filter 500 has a gain G=1 and a quality factor Q=0.76, the capacitance value of the capacitor 504b is n times greater than the capacitance value of the capacitor 504a, where n could be calculated using the following equation (1):

$$n \geq 4Q^2(1+G)=4.62 \qquad (1)$$

If n=8, then a capacitance value $C_{2,LPF}$ of the capacitor 504b is eight times greater than a capacitance value $C_{1,LPF}$ of the capacitor 504a. However, as the low-pass filter 500 is a differential low-pass filter, the equivalent capacitance value between the terminals Np and Nn is actually 4 times greater than the capacitance value of the capacitor 504a when the capacitor 504 is cascaded with a capacitor 504d, i.e., $8*C_{1,LPF}//8*C_{1,LPF}=4*C_{1,LPF}$. To put it another way, based on the proposed switching method applied to capacitors as shown in FIG. 1 and FIG. 4, only 2 unit capacitors are respectively needed by the capacitor 504b and the capacitor 504d to present 4 unit capacitors (i.e., $4*C_{1,LPF}$) between the terminals Np and Nn if each of the capacitors 504a and 504c is a unit capacitor with a capacitance value $C_{1,LPF}$.

On the other hand, when the above-mentioned differential low-pass filter 500 is switched to a band-pass filter (i.e., by the method in FIG. 2), the capacitance value $C_{BPF}$ of the feedback capacitor of the band-pass filter may be configured as a summation of capacitance values of 3 unit capacitors. That is, 2 unit capacitors of the capacitor 504b are coupled between the first input terminal (+) and the first output terminal (−) of the differential amplifier 502, and 2 unit capacitors are coupled between the second input terminal (−) and the second output terminal (+) of the differential amplifier 502. Therefore, total 6 unit capacitors are employed in this embodiment.

It should be noted that, if the value of n in the embodiment shown in FIG. 5 is set to 6, the capacitance value $C_{2,LPF}$ of the capacitor 504b is 6 times greater than the capacitance value $C_{1,LPF}$ of the capacitor 504a. However, as the low-pass filter 500 is a differential low-pass filter, the equivalent capacitance value between the terminals Np and Nn is only 3 times greater than the capacitance value of the capacitor 504a when the capacitor 504 is cascaded with a capacitor 504d, i.e., $6*C_{1,LPF}//6*C_{1,LPF}=3*C_{1,LPF}$. Therefore, based on the proposed switching method applied to capacitors as shown in FIG. 1 and FIG. 4, the capacitors 504a and 504c may be configured as a unit capacitor with a capacitance value $0.5*C_{1,LPF}$, and the capacitors 504b and 504d may be respectively configured as 3 unit capacitors. Hence, the equivalent capacitance value between the terminals Np and Nn is $3*C_{1,LPF}$. When the above-mentioned differential low-pass filter 500 is switched to a band-pass filter (i.e., by the method in FIG. 2), the capacitance value $C_{BPF}$ of the feedback capacitor of the band-pass filter may be configured as a summation of capacitance values of 4 unit capacitors. That is, 3 unit capacitors of the capacitor 504b are coupled between the first input terminal (+) and the first output terminal (−) of the differential amplifier 502, and 3 unit capacitors are coupled between the second input terminal (−) and the second output terminal (+) of the differential amplifier 502. Therefore, total 8 unit capacitors are employed in this embodiment.

If the value of n of the embodiment in FIG. 5 is set to 5 instead, the capacitance value $C_{2,LPF}$ of the capacitor 504b is 5 times greater than the capacitance value $C_{1,LPF}$ of the capacitor 504a. However, as the low-pass filter 500 is a differential low-pass filter, the equivalent capacitance value between the terminals Np and Nn is only 2.5 times greater than the capacitance of the capacitor 504a when the capacitor 504 is cascaded with a capacitor 504d, i.e., $5*C_{1,LPF}//5*C_{1,LPF}=2.5*C_{1,LPF}$. Based on the switching method applied to capacitors as shown in FIG. 1 and FIG. 4, the capacitor 504a and the capacitor 504c may be configured as a unit capacitor with a capacitance $0.25*C_{1,LPF}$, and the capacitor 504b and the capacitor 504d may be respectively configured as 3 unit capacitors. Hence, the equivalent capacitance value between the terminals Np and Nn is $2.5*C_{1,LPF}$. When the above-mentioned differential low-pass filter 500 is switched to a band-pass filter (i.e., by the method in FIG. 2), the capacitance $C_{BPF}$ of the feedback capacitor of the band-pass filter may be configured as a summation of capacitance values of 6 unit capacitors. That is, 5 unit capacitors of the capacitor 504b are coupled between the first input terminal (+) and the first output terminal (−) of the differential amplifier 502, and 5 unit capacitors are coupled between the second input terminal (−) and the second output terminal (+) of the differential amplifier 502. Therefore, total 12 unit capacitors are employed in this embodiment.

In summary, supposing that the least common multiple of the capacitance value $C_{2,LPF}$ of the capacitor 504b is $C_{segment}$, $C_{segment}$ is a unit capacitance value for the circuit layout. Then, the capacitance value $C_{1,LPF}$ of the capacitor 504a may be configured as $K*C_{segment}$, where K may be a fractional number. The capacitance value $C_{2,LPF}$ of the capacitor 504b may be configured as $N*C_{segment}$, and the capacitance value $C_{BPF}$ of the feedback capacitor of the band-pass filter may be configured as $(N+1)*C_{segment}$, where N may be an integer number.

It can be known from the above embodiments that the effect of a low-pass filtering process and a band-pass filtering process is achieved by employing only one differential amplifier in the embodiment of the present invention according to the proposed switching method applied to capacitors and resistors, as shown in FIG. 2 and FIG. 3, and the proposed design method of the capacitors, as shown in FIG. 5. In other words, the wireless transceiver implemented by the embodiments of the present invention does not require two individual filters to perform the low-pass and band-pass filtering processes, thus reducing the cost of the wireless transceiver greatly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A filtering device, applicable in a transceiver that processes a receiving signal and a transmitting signal, comprising:
    a capacitive circuit, configured to form a first capacitive configuration or a second capacitive configuration by selectively coupling a plurality of capacitors to an amplifying circuit, wherein the capacitors coupled to the amplifying circuit in the first capacitive configuration and the second capacitive configuration are not exactly the same; and
    a resistive circuit, configured to form a first resistive configuration or a second resistive configuration by selectively coupling a plurality of resistor to the amplifying circuit, wherein the resistors coupled to the amplifying circuit in the first resistive configuration and the second resistive configuration are not exactly the same;
    wherein the filtering device is operative to filter the receiving signal when the capacitive circuit operates in the first capacitive configuration and to filter the transmitting signal when the capacitive circuit operates in the second capacitive configuration, and the filtering device functions as a band-pass filter in the first capacitive configuration and a low-pass filter in the second capacitive configuration.

2. The filtering device of claim 1, wherein the resistive circuit is under the first resistive configuration when the filtering device is operative to filter the receiving signal in a first frequency band, and the resistive circuit is under the second resistive configuration when the filtering device is operative to filter the receiving signal in a second frequency band.

3. The filtering device of claim 2, wherein the first frequency band is different from the second frequency band.

4. The filtering device of claim 1, wherein the amplifying circuit has a first input terminal and a first output terminal, and a first part capacitive circuit of the capacitive circuit is coupled between the first input terminal and the first output terminal when the capacitive circuit operates in the first capacitive configuration.

5. The filtering device of claim 4, wherein the amplifying circuit further comprises a second input terminal, and the second input terminal is coupled to a reference voltage when the capacitive circuit operates in the first capacitive configuration.

6. The filtering device of claim 4, wherein the amplifying circuit further comprises a second input terminal and a second output node; and a second part capacitive circuit of the capacitive circuit is coupled between the second input terminal and the second output terminal when the capacitive circuit operates in the first capacitive configuration.

7. The filtering device of claim 1, wherein the amplifying circuit has a first input terminal, a second input terminal, a first output terminal, and a second output terminal; and when the capacitive circuit operates in the second capacitive configuration, a first part capacitive circuit of the capacitive circuit is coupled between the first input terminal and the first output terminal, a second part capacitive circuit of the capacitive circuit is coupled between a first signal input terminal and a second signal input terminal of the filtering device, a third part capacitive circuit of the capacitive circuit is coupled between the second input terminal and the second output terminal, and a fourth part capacitive circuit of the capacitive circuit is coupled between the first signal input terminal and the second signal input terminal.

8. The filtering device of claim 7, wherein a capacitance value of the second part capacitive circuit is greater than a capacitance value of the first part capacitive circuit and a capacitance value of the fourth part capacitive circuit is greater than a capacitance value of the third part capacitive circuit.

9. The filtering device of claim 7, wherein when the capacitive circuit operates in the first capacitive configuration, the first capacitive circuit and the second capacitive circuit of the capacitive circuit are both coupled between the first input terminal and the first output terminal, and the third capacitive circuit and the fourth capacitive circuit of the capacitive circuit are both coupled between the second input terminal and the second output terminal.

10. The filtering device of claim 7, further comprising:
a first switch, coupled between the first signal input terminal and a first layout layer of the second part capacitive circuit;
a second switch, coupled between a first layout layer of the first part capacitive circuit and the first layout layer of the second part capacitive circuit;
a third switch, coupled between the first layout layer of the second part capacitive circuit and a first layout layer of the fourth part capacitive circuit;
a fourth switch, coupled between a second layout layer of the first part capacitive circuit and a second layout layer of the second part capacitive circuit;
a fifth switch, coupled between the second signal input terminal and a second layout layer of the fourth part capacitive circuit;
a sixth switch, coupled between a first layout layer of the third part capacitive circuit and the second layout layer of the fourth part capacitive circuit;
a seventh switch, coupled between the second layout layer of the fourth part capacitive circuit and the second layout layer of the second part capacitive circuit; and
a eighth switch, coupled between the second layout layer of the third part capacitive circuit and the first layout layer of the fourth part capacitive circuit;
wherein the first layout layer of the first part capacitive circuit is coupled to the first output terminal, the second layout layer of the first part capacitive circuit is coupled to the first output terminal, the first layout layer of the third part capacitive circuit is coupled to the second output terminal, and the second layout layer of the third part capacitive circuit is coupled to the second input terminal.

11. The filtering device of claim 10, wherein the first layout layer of the first part capacitive circuit, the first layout layer of the second part capacitive circuit, the first layout layer of the third part capacitive circuit, and the second layout layer of the fourth part capacitive circuit are located at a first integrated circuit layout layer, and the second layout layer of the first part capacitive circuit, the second layout layer of the second part capacitive circuit, the second layout layer of the third part capacitive circuit, and the first layout layer of the fourth part capacitive circuit are located at a second integrated circuit layout layer is different from the first integrated circuit layout layer.

12. The filtering device of claim 10, wherein when the capacitive circuit operates in the first capacitive configuration, the first switch, the third switch, the fifth switch, and the seventh switch are switched off, and the second switch, the fourth switch, the sixth switch, and the eighth switch are switched on; and when the capacitive circuit operates in the second capacitive configuration, the first switch, the third switch, the fifth switch, and the seventh switch are switched on, and the second switch, the fourth switch, the sixth switch, and the eighth switch are switched off.

* * * * *